US011811362B1

(12) United States Patent
Baldisserotto et al.

(10) Patent No.: US 11,811,362 B1
(45) Date of Patent: Nov. 7, 2023

(54) VOLTAGE CONTROLLED OSCILLATOR (VCO) WITH ADAPTIVE TEMPERATURE COMPENSATION

(71) Applicant: Cadence Design Systems, Inc., San Jose, CA (US)

(72) Inventors: Alberto Baldisserotto, Cary, NC (US); Aida Varzaghani, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/983,359

(22) Filed: Nov. 8, 2022

(51) Int. Cl.
*H03B 5/04* (2006.01)
*H03L 7/099* (2006.01)
*H03L 1/00* (2006.01)
*H03L 1/02* (2006.01)

(52) U.S. Cl.
CPC ............. *H03B 5/04* (2013.01); *H03L 1/00* (2013.01); *H03L 1/02* (2013.01); *H03L 7/099* (2013.01)

(58) Field of Classification Search
CPC .... H03B 5/04; H03B 5/12; H01L 1/00; H01L 1/02; H03L 1/00; H03L 1/02
USPC .............. 331/176, 177 V, 117 FE, 167
See application file for complete search history.

(56) References Cited

U.S. PATENT DOCUMENTS 7,307,486 B2 * 12/2007 Pernia ...................... H03L 1/00
331/177 V

OTHER PUBLICATIONS

Mirajkar, Peeyoosh, et al., "Low Phase Noise Ku-Band VCO with Reduced Frequency Drift Across Temperature", IEEE International Symposium on Circuits and Systems, (May 2018), 5 pgs.
Saeidi, Behzad, et al., "A Wide-Range VCO with Optimum Temperature Adaptive Tuning" IEEE Radio Frequency Integrated Circuits Symposium, (2010), 4 pgs.
Wu, Ting, et al., "Dependence of LC VCO Oscillation Frequency on Bias Current", IEEE International Symposium on Circuits and Systems, (2006), 4 pgs.
You, Yang, et al., "A Temperature-Compensated LC-VCO PLL and a Power-Efficient (Decision Feedback Equalizer for Multi-Standard Serial Links", 14th IEEE International Conference on Solid-State and Integrated Circuit Technology, (Oct. 2018), 4 pgs.

* cited by examiner

*Primary Examiner* — Arnold M Kinkead
(74) *Attorney, Agent, or Firm* — Schwegman Lundberg & Woessner, P.A.

(57) ABSTRACT

Aspects of the present disclosure include systems and methods for temperature adaptive voltage controlled oscillators. In one example, a voltage controlled oscillator includes a cross junction circuit electrically coupled to a temperature dependent input current, and an inductor circuit electrically coupled to the cross junction circuit. The voltage controlled oscillator additionally includes a capacitor bank circuit electrically coupled to the inductor circuit, and an input node that receives a control voltage. The voltage controlled oscillator further includes an output node configured to provide an oscillation frequency output, wherein the oscillation frequency output is controlled by the control voltage.

16 Claims, 7 Drawing Sheets

VOLTAGE CONTROLLED OSCILLATOR (VCO) WITH ADAPTIVE TEMPERATURE COMPENSATION

TECHNICAL FIELD

The present disclosure generally relates to the technical field of voltage controlled oscillators (VCOs). In particular, the present disclosure addresses systems and methods for temperature adaptive VCOs.

BACKGROUND

A voltage controlled oscillator (VCO) is an electronic oscillator whose oscillation frequency is controlled by an input voltage. That is, an applied input voltage determines an oscillation frequency provided as output by the VCO. Accordingly, the VCO can be used for frequency modulation (FM) or phase modulation (PM) by applying a modulating signal as the control input voltage.

BRIEF DESCRIPTION OF THE SEVERAL VIEWS OF THE DRAWINGS

Various ones of the appended drawings merely illustrate example embodiments of the present inventive subject matter and cannot be considered as limiting its scope.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Certain frequency oscillators, such as voltage controlled oscillators (VCOs), receive an input signal and provide as output a desired oscillation frequency. A VCO, in particular, receives a voltage signal as an input control signal, and produces the desired oscillation frequency based on the voltage signal. However, ambient and/or internal temperature variations can result in changes in the oscillation frequency, for example, due to capacitor curve shifting, resistance temperature dependency, inductance temperature shifts, and so on. In some examples, various VCO input voltage-to-output frequency curves are provided, each curve to be used for certain temperature ranges. A user can then calibrate the VCO by selecting an input voltage-to-output frequency curve based on expected temperatures occurring during use of the VCO. However, temperature variations outside of the range for the selected curve can result in the VCO's oscillation frequency output not being as desired.

The techniques described herein provide for a temperature adaptive VCO that uses analog domain techniques to account for temperature variations and adjust the temperature adaptive VCO accordingly. In one example, a temperature-dependent current produced based on an analog circuit is then injected into the temperature adaptive VCO, as further described below, to counteract the effect of temperature on VCO circuitry. By automatically adjusting the temperature adaptive VCO in the analog domain to account for changes in temperature, the techniques described herein provide for a more accurate and reliable VCO.

Figure 1:
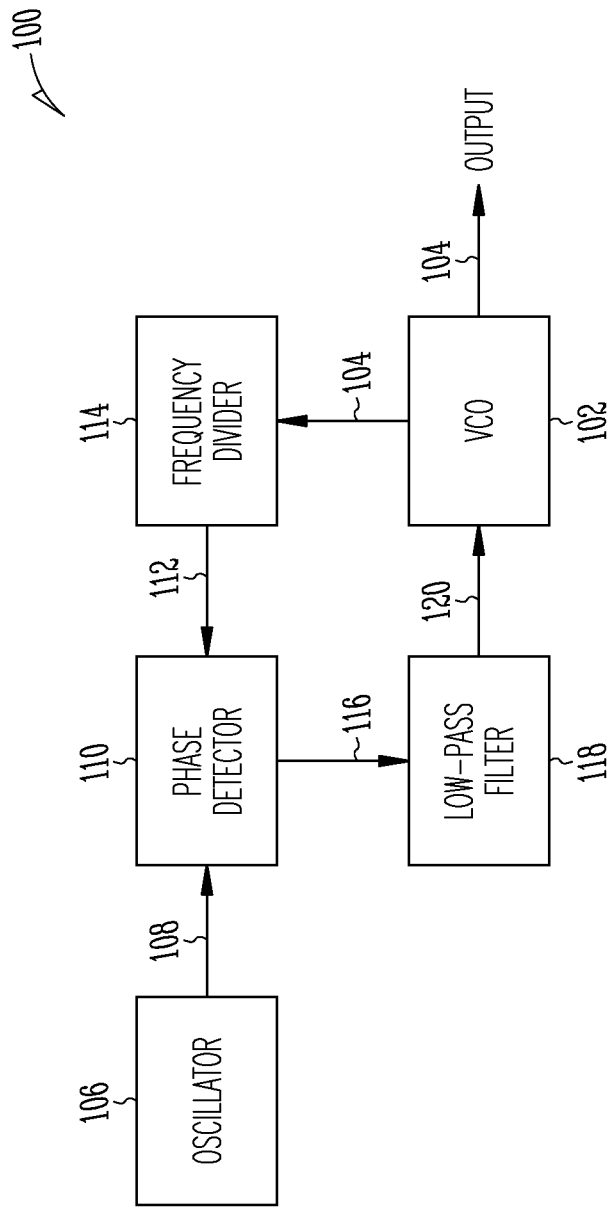
FIG. 1 is a block diagram illustrating a phase-locked loop (PLL) circuit that includes a temperature adaptive VCO, according to some examples.

It may be beneficial to illustrate an example circuit that incorporates a temperature adaptive VCO. Turning now to FIG. 1, the figure is a block diagram of a circuit 100 that includes an example temperature adaptive VCO 102, according to some examples. More specifically, the circuit 100 is an example of a PLL circuit 100 using the temperature adaptive VCO 102 in a feedback loop to output a desired oscillation frequency 104. The PLL circuit 100 transforms a phase of the temperature adaptive VCO 102 to match an input signal, e.g., and oscillator or clock signal. In the depicted example, an oscillator 106, such as a quartz-based oscillator or a clock, injects as input an oscillating frequency signal 108 into a phase detector 110. The phase detector 110, also sometimes referred to as a phase comparator of mixer, compares the phases of the signal 108 incoming from the oscillator 106 with a frequency signal 112 incoming from a frequency divider 114, and generates a voltage signal based on a phase difference between the two signals 108, 112. The phase detector 110 can also multiply the oscillator 106 signal 108 and/or the frequency divider 114 signal 112, and provides an output voltage signal 116 to a low-pass filter 118.

The low-pass filter 118 attenuates or otherwise smooths (and flattens) an alternating current (AC) component of the signal 116 incoming from the phase detector 110 to deliver a filtered signal 120 into the temperature adaptive VCO 102. The temperature adaptive VCO 102 then outputs the oscillation frequency 104 to closely match the frequency in the signal 120 provided by the low-pass filter 118. The frequency divider 114 can be used to reduce the oscillation frequency 104 by an adjustable factor, e.g., 2, 4, 8, and so on. The PLL circuit 100 thus reduces phase errors between output (e.g., VCO 102) and input (e.g., oscillator 106) frequencies. When the phase difference between the output (e.g., VCO 102) and input (e.g., oscillator 106) is near zero or zero, the PLL circuit 100 is said to be "locked." Accordingly, the PLL circuit 100 generates the output signal (e.g., oscillation frequency 104) to have a phase matching a phase of the input signal 108.

Figure 2:
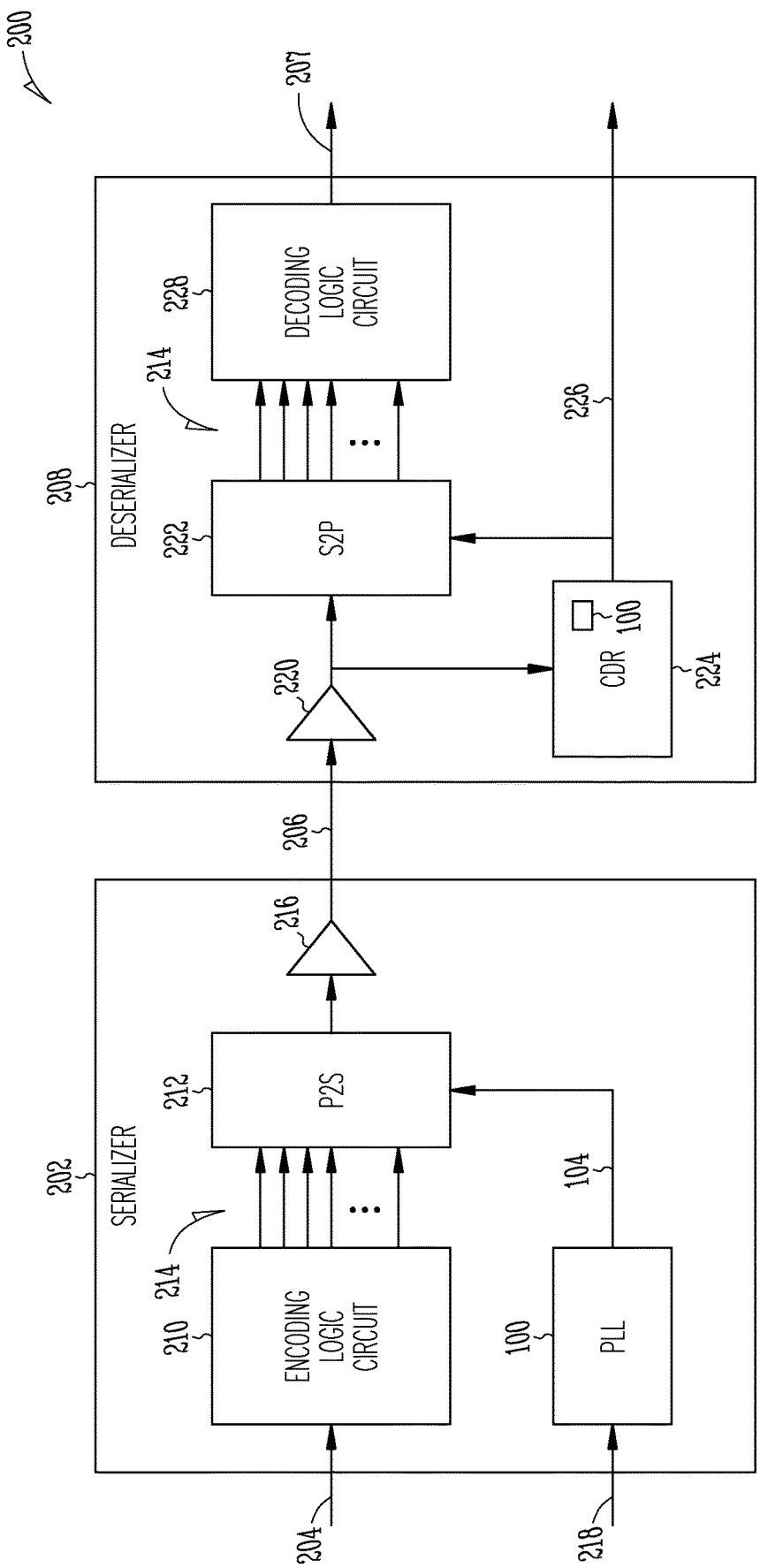
FIG. 2 is a block diagram depicting a serializer-deserializer (SerDes) circuit having a PLL circuit, according to some examples.

The VCO-based PLL circuit 100 can be used in a variety of systems, such as telecommunication systems, computing systems, radio systems, and so on. For example, FIG. 2 is a block diagram depicting an embodiment of a serializer-deserializer system 200 that includes the VCO-based PLL circuit 100, according to some examples. In the depicted embodiment, a serializer system 202 takes as input parallel data 204, and transmits serial data 206. A deserializer system 208 received the serial data 206 and converts the serial data 206 into output parallel data 207, which is equivalent to and replicates parallel data 204.

In some examples, the input parallel data 204 is processed by an encoding logic circuit 210 to encode the parallel data 204, for example, via 8 bit-to-10 bit (8 b/10 b) encoding, 64 bit-to-66 bit (64 b/66 b) encoding, and the like, to provide for direct current (DC) balance and a reasonable number of state changes for clock recovery. A parallel-to-serial converter 212 then converts the encoded parallel data 214 into the serial data 206 that can be transmitted via a line driver 216, also referred to as a signal buffer.

In the depicted example, the PLL circuit 100 uses a reference clock signal 218 as input and produces the oscillation frequency 104 as output. The oscillation frequency 104 is then used as a serial data transmission frequency by the parallel-to-serial converter 212 to serialize the encoded data into the serial data 206, for example. In some examples, the oscillation frequency 104 is a multiplied value of the reference clock signal 218, so that if the reference clock signal 218 is in a megahertz (MHz) range the oscillation frequency 104 can be in a gigahertz (GHz) range. Indeed, the PLL circuit 100 can enable high speed transmissions of data in the GHz range.

In the depicted example, the serial data 206 is received into a line driver 220, also referred to as a signal buffer, which then provided the serial data 206 to a serial-to-parallel converter 222. A clock and data recovery circuit 224 is used to extract, via clock recovery, a recovered clock signal 226 embedded in the serial data 206 and to sample and retime, via data recovery, the pulses of the "sliced" signals of the serial data 206. In some examples, the PLL circuit 100 can also be included as part of the clock and data recovery circuit 224 and used to provide a reference oscillation frequency signal useful in clock and/or data recovery.

The serial-to-parallel converter 222 can use the recovered clock signal 226 to extract the encoded parallel data 214, which is then provided to a decoding logic circuit 228 to decode and/or frame align the encoded parallel data 214 into the originally transmitted parallel data 204. The SerDes system 200 can thus provide for high speed communications in the GHz range over a single line or differential pair, as opposed to parallel lines. However, during operations, ambient heat and/or heat generated by components in various circuitry of the serializer-deserializer system 200, the PLL 100, and/or the temperature adaptive VCO 102, can cause heat related issues such as frequency drift. The techniques described herein provide for minimizing and in some cases eliminating temperature-based oscillation frequency drift, as further described below.

Figure 3:
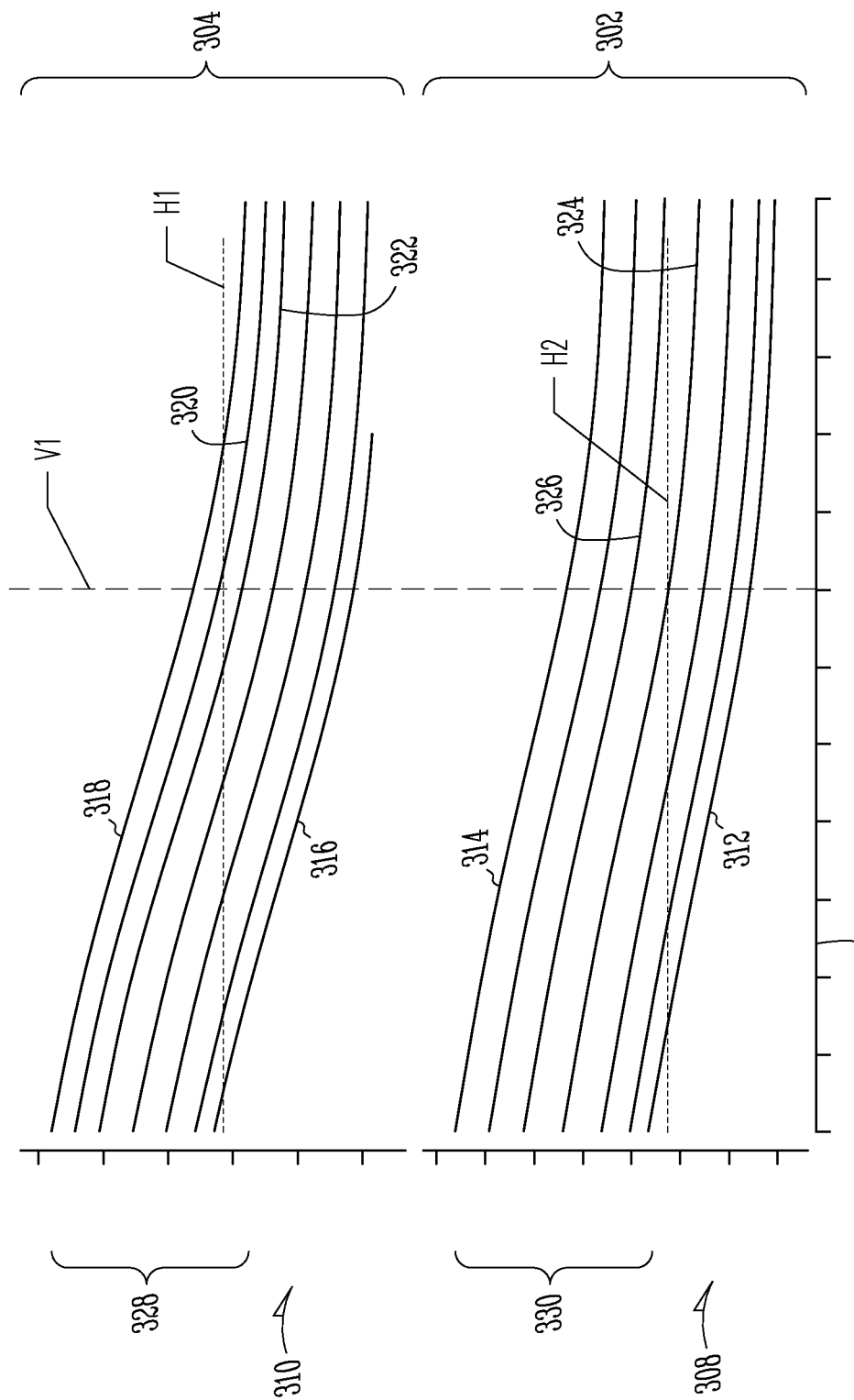
FIG. 3 illustrates two oscillation frequency curves representative of oscillation frequencies that are produced as output by a traditional VCO and by a temperature adaptive VCO, according to some examples.

FIG. 3 illustrates two sets of example oscillation frequency curves 302, 304 representative of oscillation frequencies that are produced as output by a traditional VCO and by the temperature adaptive VCO 102, respectively, based on a control voltage used as input, according to some examples. More specifically, the curves 302 are based on a traditional VCO while the curves 304 are based on the temperature adaptive VCO 102. In the depicted example, each of the sets of curves 302, 304 are plotted against a X axis 306 having an increasing control voltage and Y axes 308, 310 both having an increasing oscillation frequency. As depicted, when the control voltage increases, the resulting oscillation frequency for each curve in the set of curves 302, 304, decreases. That is, both the traditional VCO and the temperature adaptive VCO will output a smaller oscillation frequency as the control voltage used for input increases. In the depicted example, a voltage V1 results in a frequency H1 when using the temperature adaptive VCO 102, and a frequency H2 when using the traditional VCO.

A user can calibrate both the traditional VCO and the temperature adaptive VCO 102 for a desired temperature by selecting a specific curve. For example, a bottom-most curve 312 can be selected for traditional VCO use at a high temperature (e.g., 125° C.) while a top-most curve 314 can be selected for traditional VCO use at low temperatures (e.g., −40° C.). Likewise, a bottom-most curve 316 can be selected for temperature adaptive VCO 102 use at a high temperature (e.g., 125° C.) while a top-most curve 318 can be selected for temperature adaptive VCO 102 use at low temperatures (e.g., −40° C.). More specifically, a VCO circuit at a higher operating temperature uses a lower curve, so that each of the curves' 302, 304 heights in the Y dimension correspond to an operating temperature, with a lower Y value corresponding to a higher operating temperature.

As mentioned earlier, a user can calibrate either the traditional VCO or the temperature adaptive VCO 102 to select any one of the curves in the set of curves 302, 304. Once a particular curve has been selected via calibration, a control voltage can be provided as input and a desired oscillation frequency will then be produced as output. However, ambient heating and cooling as well as temperature changes caused by the components in the traditional VCO and the temperature adaptive VCO 102 may cause shifting from one curve to another. For example, additional heat may cause curve 320 to shift into curve 322. Likewise, curve 324 may shift into curve 326 due to, for example, cold weather. Unwanted curve shifts may cause the control voltage to be less effective in selecting the desired oscillating frequency.

In the example set of curves 304, a frequency spread or distance 328 between the bottom-most curve 316 (e.g., curve used for temperatures of 125° C.) and the top-most curve 318 (e.g., curve used for temperatures of −40° C.) is smaller than a frequency spread of distance 330 between the bottom-most curve 312 (e.g., curve used for temperatures of 125° C.) and the top-most curve 314 (e.g., curve used for temperatures of −40° C.). The smaller frequency spread 328 results in improved operations during changes in temperature because curve shifts are not as pronounced when using the temperature adaptive VCO 102. Further, it may be possible to coalesce or compact the set of curves 304 into a single curve that may not experience temperature shifts at all. Indeed, the temperature adaptive VCOs described herein can operate at temperatures between −60° C. and 150° C.

Figure 4:
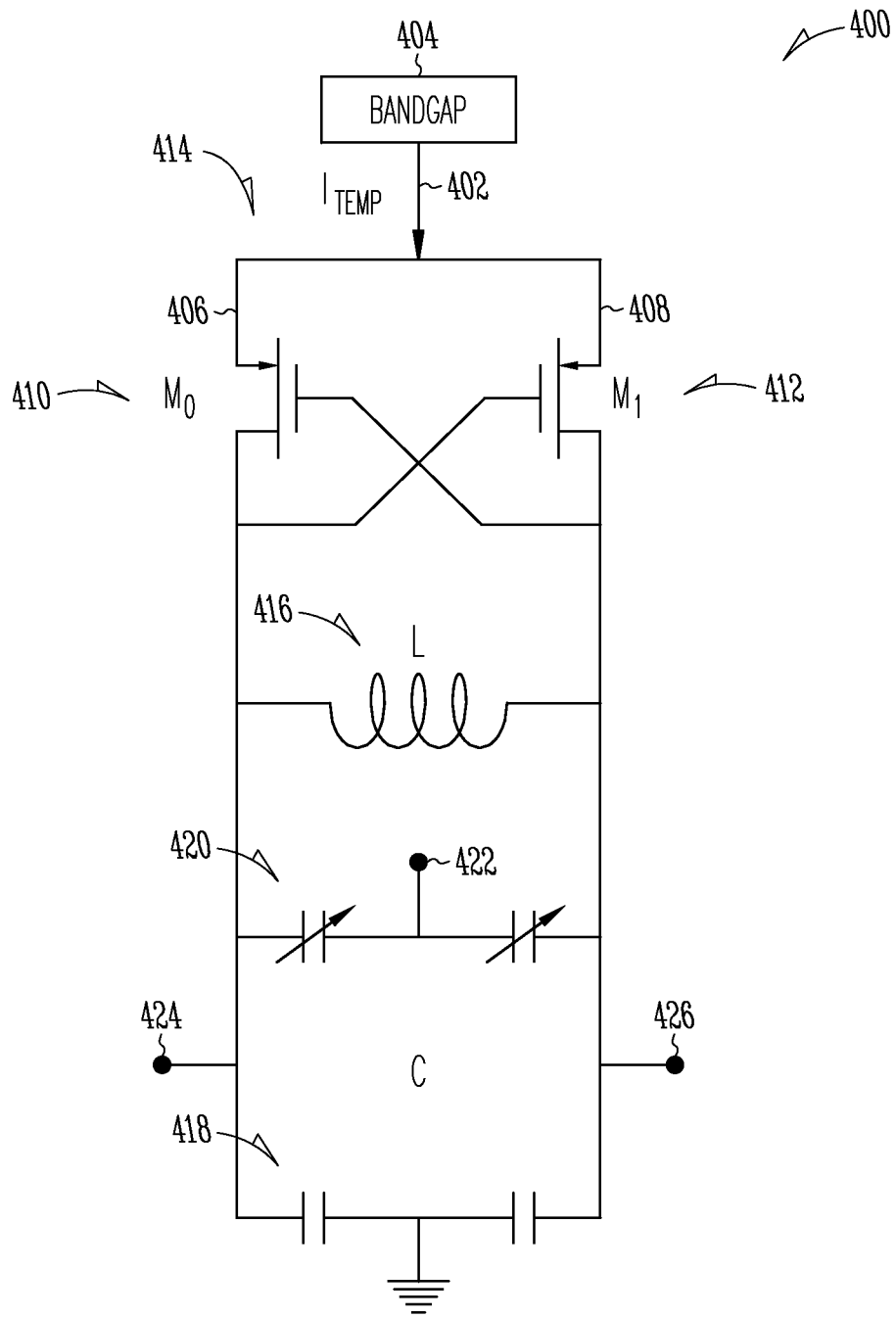
FIG. 4 is a circuit diagram illustrating a simplified example of a temperature adaptive VCO, according to some examples.

FIG. 4 is a circuit diagram of a simplified example of a temperature adaptive VCO 400, according to some examples. In the depicted example, the temperature adaptive VCO 400 uses as input a current 402 that is delivered by a bandgap voltage reference circuit 404. Unlike traditional VCOs, the temperature adaptive VCO 400 uses a temperature dependent input current 402. More specifically, a traditional VCO typically uses a reference current that does not vary with temperature. The temperature dependent input current 402, in the depicted example, will vary negatively with temperature. More specifically, the temperature dependent input current 402 is a complementary-to-absolute temperature (CTAT) current that varies negatively based on increased temperatures. That is, as temperatures rise, the CTAT current will fall.

In the depicted example, the temperature dependent input current 402 is provided via a bandgap voltage reference circuit 404. The bandgap voltage reference circuit 404 can be any type of bandgap circuit, such as a Brokaw bandgap reference circuit, a Widlar bandgap reference circuit, and so on, suitable for providing a temperature-based voltage. In one example, the bandgap voltage reference circuit 404 provides for a temperature invariant current Iref, as well as a proportional-to-absolute temperature (PTAT) current. The PTAT current varies positively with increased temperature. In one example, the temperature dependent input current 402 may be derived by using Iref and subtracting PTAT. That is, CTAT can be derived as CTAT=Iref−PTAT.

The temperature dependent input current 402 is provided to drains 406, 408 of active devices (e.g., transistors) 410, 412. In the depicted example, the active devices 410, 412 are connected as a cross junction circuit 414, e.g., a transconductance (Gm) circuit. The temperature adaptive VCO 400 uses an inductor circuit 416 (L) and a capacitor bank circuit 418 (C) to provide for oscillation, and may thus be referred to as a temperature adaptive LC VCO circuit. The example temperature adaptive VCO 400 also includes a varactor (variable capacitor) circuit 420. The capacitor bank circuit 418 may be used, for example, to calibrate the temperature adaptive VCO 400 by selecting on of the curves in the set of curves 304 based on a varying the capacitance of the bank. A voltage control signal provided via node 422 can then be used to generate the desired oscillation frequency, which can be outputted via nodes 424, 426.

In use, ambient temperatures may affect the behavior of the circuits 414, 416, 420, and 418. For example, higher temperatures may result in the output oscillation frequency to go down, while colder temperatures may result in the output oscillation frequency to go up. However, the temperature dependent input current 402 will now also track temperature. More specifically, the temperature dependent input current 402 will go down as temperature rises, and up as temperature falls, thus counteracting the effects of the temperature variations. The rise and fall of the temperature dependent input current 402 is in the analog domain via the bandgap voltage reference circuit 404, That is, no digital computations are used to create temperature-based variations in the temperature dependent input current 402. Accordingly, a more efficient temperature adaptive VCO 400 is provided, which can provide consistent operations in a more varied temperature range.

Figure 5:
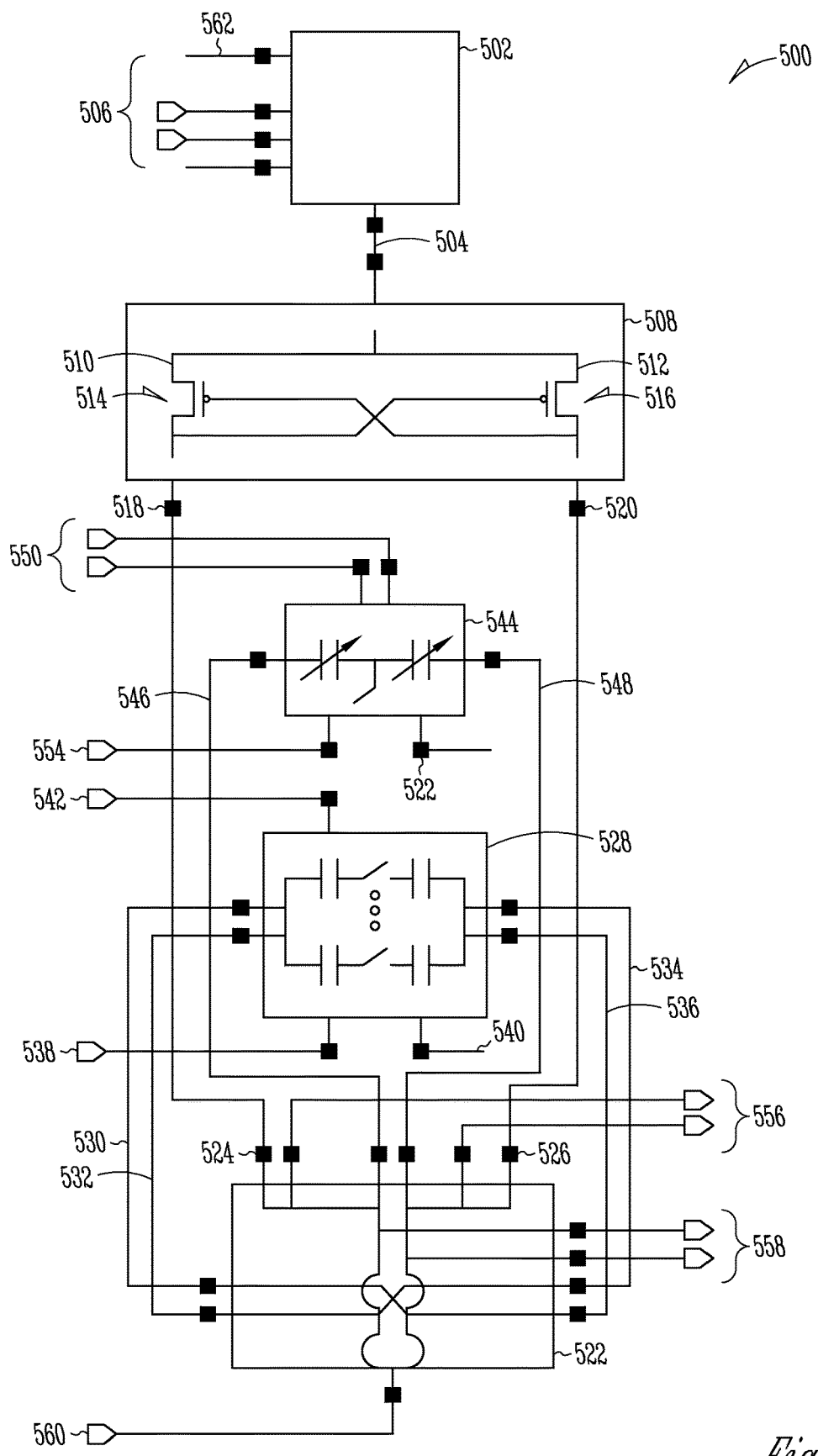
FIG. 5 is a circuit diagram illustrating a temperature adaptive VCO having a variable resistor-based circuit to provide for a temperature dependent current, according to some examples.

In some examples, the temperature dependent input current 402 may be provided via a variable resistor-based circuit, as shown in FIG. 5, according to some examples. More specifically, the figure depicts an example temperature adaptive VCO 500 that includes a variable resistor circuit 502 (e.g., which can be an integrated circuit) that can deliver as output a temperature dependent current 504. That is, by varying resistance, a varying current is provided as the temperature dependent current 504. In the depicted embodiment, inputs 506 to the variable resistor circuit 502 include power, as well as a signal such as a CTAT voltage that can be derived from the CTAT current. For example, bandgap circuits, such as a Brokaw bandgap reference circuit, a Widlar bandgap reference circuit, and so on, that provide for temperature-based voltages, can be used to provide for a CTAT-based reference voltage that varies negatively as temperatures rise. As mentioned above, in one example, a non-temperature dependent voltage can be produced by the bandgap voltage reference circuit 404 and used to provide a CTAT voltage 562.

In one example, the variable resistor circuit 502 can produce a percentage of the CTAT current to inject as the temperature dependent current 504. That is, the variable resistor circuit 502 can inject a percentage between 0% to 100% of the CTAT current as the temperature dependent current 504, enabling certain calibration of the temperature dependent current 504. For example, by varying resistance of the CTAT voltage 562, a desired percentage of the CTAT current can be provided. If the selection is 0% of the CTAT current then only a temperature invariant current is used as input, while a selection of 50% of the CTAT current results in injecting half of a temperature invariant current and half of the CTAT current. Accordingly, the temperature dependent current 504 can be calibrated in this manner.

The temperature dependent current 504 is provided into a cross junction circuit 508, e.g., a transconductance circuit. More specifically, the temperature dependent current 504 is provided to drains 510, 512, of active devices 514, 516 (e.g., transistor devices). Sources 518, 520 (e.g., P source 518 and N source 520, respectively) are then electrically coupled to an inductor circuit 522. More specifically, the sources 518, 520 are coupled at opposite ends of the inductor circuit 522 at nodes 524, 526, respectively.

A capacitor bank circuit 528 is also shown, electrically coupled to the inductor circuit 522 via conduits 530, 532, 534, 536. In use the capacitor bank circuit 528 can select one of the oscillation frequency curves from the set of oscillation frequency curves 304. For example, a voltage signal can be applied to node 538 to select any one of the oscillation frequency curves 304. A node 540 may be used to supply power, for example via a power supply, to the capacitor bank circuit 528, while a node 542 may turn on and off the capacitor bank circuit 528.

A varactor circuit 544 is also shown, electrically coupled to the inductor circuit 522 via conduits 546, 548. Nodes 550 may be used to set a desired capacitance for one or more of the varactors in the varactor circuit 544. Node 552 is used to provide power, e.g., via a power supply. In use, node 554 receives an input control voltage that is then used by the temperature adaptive VCO 500 to produce a desired oscillation frequency. The output oscillation frequency output can be provided via nodes 556, 558 (e.g., nodes at opposite ends of the inductor circuit 522). Node 560 can be used to connect to power supply ground.

As ambient temperatures change, the temperature dependent current 504 will change accordingly, and will ameliorate, and in some cases, eliminate, the effects of temperature on the temperature adaptive VCO 500. For example, increases in temperature that would have resulted in the oscillation frequency output decreasing are now counteracted by a smaller temperature dependent current 504. Likewise, decreases in temperature that would have resulted in the oscillation frequency output increasing are now counteracted by a higher temperature dependent current 504. That is, temperature effects, such as ambient effects and/or heating/cooling of components included in the temperature adaptive VCO 500 are now reduced, and, in some cases, eliminated, by increasing or lowering the temperature dependent current 504. It is to be noted that the changes in the temperature dependent current 504 happen without digital computations (e.g., without using a processor). That is, bandgap circuitry used to create the temperature dependent current 504 will also experience similar or the same temperature effects, and will increase or reduce CTAT voltage and current, typically proportionally (e.g., via PTAT). Accordingly, a more efficient and robust temperature adaptive VCO 500 is provided.

Figure 6:
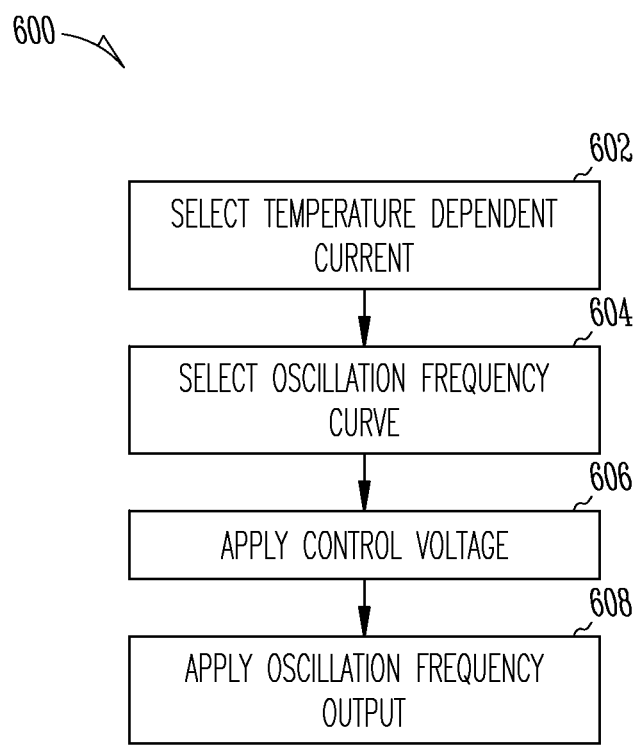
FIG. 6 is a flowchart of a process to use a temperature adaptive VCO, according to some examples.

FIG. 6 is a flowchart illustrating an example process 600 that is used for certain applications of the techniques described herein, according to some examples. The process 600 selects, at block 602, a temperature dependent current (e.g., current, 402, 504) to be use during operations of a temperature adaptive VCO (e.g., VCO 400, 500). In some examples, a percentage of the temperature dependent current is used, such as between 0% to 100% of CTAT. For example, 100% of a temperature invariant current can be used when the CTAT current is at 0%, 70% of the temperature invariant current can be used when the CTAT current is at 30%, and so on. It is to be noted that the temperature dependent current can be selected, at block 602, at a manufacturing facility or during field operations by a user of the voltage controlled oscillator. For example, a manufacturer may decide to provide the temperature dependent current at a given percentage, e.g., between 50% and 100% of CTAT. A user of the temperature adaptive VCO can also select the temperature dependent current (e.g., as a percentage of CTAT) by adjusting the variable resistor circuit 502 during field operations.

The process 600 can also select, at block 604, an oscillation frequency curve to use, such as one of the oscillation frequency curves 304. For example, a selection signal can be applied to capacitor bank circuits (e.g., circuits 418, 528) or the capacitor bank can be reconfigured to provide an oscillation frequency output that will follow a selected oscillation frequency curve. A control voltage can then be applied, at block 606, for example, at node 422 of the temperature adaptive VCO 400 and/or node 554 of the temperature adaptive VCO 500 to produce an oscillation frequency based on the selected oscillation frequency curve.

The resulting oscillation frequency output can then be applied, at block 608, in a variety of ways. For example, the oscillation frequency output can be used in a phase-locked loop (PLL) circuit that uses a feedback loop to output a desired oscillation frequency. Likewise, the oscillation frequency output can be used in a serializer-deserializer (SerDes) system to provide for more efficient and temperature adaptive communications.

Although the described flowcharts can show operations as a sequential process, many of the operations can be performed in parallel or concurrently. In addition, the order of the operations may be re-arranged. A process is terminated when its operations are completed. A process may correspond to a method, a procedure, an algorithm, etc. The operations of methods may be performed in whole or in part, may be performed in conjunction with some or all of the operations in other methods, and may be performed by any number of different systems, such as the systems described herein, or any portion thereof, such as a processor included in any of the systems.

Figure 7:
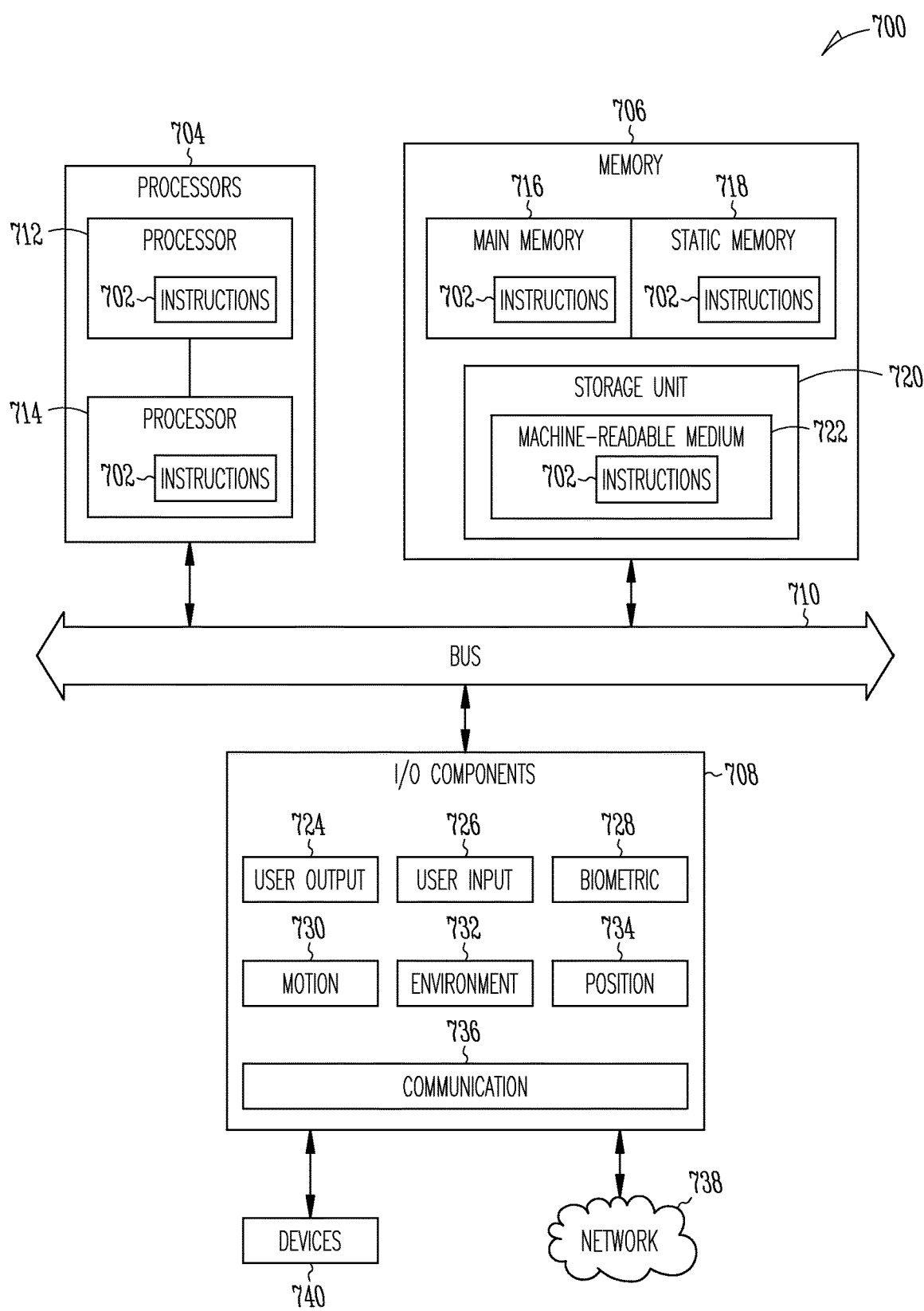
FIG. 7 is a block diagram depicting a machine suitable for executing instructions via one or more processors, according to some examples.

FIG. 7 is a diagrammatic representation of a machine 700 within which instructions 702 (e.g., software, a program, an application, an applet, an app, or other executable code) for causing the machine 700 to perform any one or more of the methodologies discussed herein may be executed. For example, the instructions 702 may cause the machine 700 to execute any one or more of the processes or methods described herein, such as the process 600. The instructions 702 transform the general, non-programmed machine 700 into a particular machine 700 programmed to carry out the described and illustrated functions in the manner described. The machine 700 may operate as a standalone device or may be coupled (e.g., networked) to other machines. In a networked deployment, the machine 700 may operate in the capacity of a server machine or a client machine in a server-client network environment, or as a peer machine in a peer-to-peer (or distributed) network environment. The machine 700 may comprise, but not be limited to, a server computer, a client computer, a personal computer (PC), a tablet computer, a laptop computer, a netbook, a set-top box (STB), a personal digital assistant (PDA), an entertainment media system, a cellular telephone, a smartphone, a mobile device, a wearable device (e.g., a smartwatch), a smart home device (e.g., a smart appliance), other smart devices, a web appliance, a network router, a network switch, a network bridge, or any machine capable of executing the instructions 702, sequentially or otherwise, that specify actions to be taken by the machine 700. Further, while a single machine 700 is illustrated, the term "machine" shall also be taken to include a collection of machines that individually or jointly execute the instructions 702 to perform any one or more of the methodologies discussed herein. In some examples, the machine 700 may also comprise both client and server systems, with certain operations of a particular method or algorithm being performed on the server-side and with certain operations of the particular method or algorithm being performed on the client-side.

The machine 700 may include processors 704, memory 706, and input/output I/O components 708, which may be configured to communicate with each other via a bus 710. In an example, the processors 704 (e.g., a Central Processing Unit (CPU), a Reduced Instruction Set Computing (RISC) Processor, a Complex Instruction Set Computing (CISC) Processor, a Graphics Processing Unit (GPU), a Digital Signal Processor (DSP), an Application-Specific Integrated Circuit (ASIC), a Radio-Frequency Integrated Circuit (RFIC), another processor, or any suitable combination thereof) may include, for example, a processor 712 and a processor 714 that execute the instructions 702. The term "processor" is intended to include multi-core processors that may comprise two or more independent processors (sometimes referred to as "cores") that may execute instructions contemporaneously. Although FIG. 7 shows multiple processors 704, the machine 700 may include a single processor with a single-core, a single processor with multiple cores (e.g., a multi-core processor), multiple processors with a single core, multiple processors with multiples cores, or any combination thereof.

The memory 706 includes a main memory 716, a static memory 718, and a storage unit 720, both accessible to the processors 704 via the bus 710. The main memory 716, the static memory 718, and storage unit 720 store the instructions 702 embodying any one or more of the methodologies or functions described herein. The instructions 702 may also reside, completely or partially, within the main memory 716, within the static memory 718, within machine-readable medium 722 within the storage unit 720, within at least one of the processors 704 (e.g., within the processor's cache memory), or any suitable combination thereof, during execution thereof by the machine 700.

The I/O components 708 may include a wide variety of components to receive input, provide output, produce output, transmit information, exchange information, capture measurements, and so on. The specific I/O components 708 that are included in a particular machine will depend on the type of machine. For example, portable machines such as mobile phones may include a touch input device or other such input mechanisms, while a headless server machine will likely not include such a touch input device. It will be appreciated that the I/O components 708 may include many other components that are not shown in FIG. 7. In various examples, the I/O components 708 may include user output components 724 and user input components 726. The user output components 724 may include visual components (e.g., a display such as a plasma display panel (PDP), a light-emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The user input components 726 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and force of touches or touch gestures, or other tactile input components), audio input components (e.g., a microphone), and the like.

In further examples, the I/O components 708 may include biometric components 728, motion components 730, environmental components 732, or position components 734, among a wide array of other components. For example, the biometric components 728 include components to detect expressions (e.g., hand expressions, facial expressions, vocal expressions, body gestures, or eye-tracking), measure biosignals (e.g., blood pressure, heart rate, body temperature, perspiration, or brain waves), identify a person (e.g., voice identification, retinal identification, facial identification, fingerprint identification, or electroencephalogram-based identification), and the like. The motion components 730 include acceleration sensor components (e.g., accelerometer), gravitation sensor components, rotation sensor components (e.g., gyroscope).

The environmental components 732 include, for example, one or cameras (with still image/photograph and video capabilities), illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 734 include location sensor components (e.g., a global positioning system (GPS) receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 708 further include communication components 736 operable to couple the machine 700 to a network 738 or devices 740 via respective coupling or connections. For example, the communication components 736 may include a network interface component or another suitable device to interface with the network 738. In further examples, the communication components 736 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 740 may be another machine or any of a wide variety of peripheral devices (e.g., a peripheral device coupled via a universal serial bus (USB) port), internet-of-things (IoT) devices, and the like.

Moreover, the communication components 736 may detect identifiers or include components operable to detect identifiers. For example, the communication components 736 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 736, such as location via Internet Protocol (IP) geolocation, location via Wi-Fi® signal triangulation, location via detecting an NFC beacon signal that may indicate a particular location, and so forth.

The various memories (e.g., main memory 716, static memory 718, and memory of the processors 704) and storage unit 720 may store one or more sets of instructions and data structures (e.g., software) embodying or used by any one or more of the methodologies or functions described herein. These instructions (e.g., the instructions 702), when executed by processors 704, cause various operations to implement the disclosed examples.

The instructions 702 may be transmitted or received over the network 738, using a transmission medium, via a network interface device (e.g., a network interface component included in the communication components 736) and using any one of several well-known transfer protocols (e.g., hypertext transfer protocol (HTTP)). Similarly, the instructions 702 may be transmitted or received using a transmission medium via a coupling (e.g., a peer-to-peer coupling) to the devices 740.

The techniques described herein provide for a temperature adaptive VCO that can counteract temperature effects due to ambient temperature and temperature changes of internal components. Circuits in an analog domain account for temperature variations and adjust the temperature adaptive VCO accordingly. In one example, a temperature-dependent current produced based on an analog circuit is then injected into the temperature adaptive VCO automatically to counteract the effect of temperature on VCO circuitry. By adjusting the temperature adaptive VCO in the analog domain to account for changes in temperature, the techniques described herein provide for a more accurate VCO that can adapt to wider temperature variations.

What is claimed is:

1. A system comprising:
a voltage controlled oscillator comprising:
  a cross junction circuit electrically coupled to a temperature dependent input current;
  an inductor circuit electrically coupled to the cross junction circuit;
  a capacitor bank circuit electrically coupled to the inductor circuit;
  an input node configured to receive a control voltage; and
  an output node electrically coupled to the inductor circuit and configured to provide an oscillation frequency output, wherein the oscillation frequency output is controlled by the control voltage; and
  an analog temperature dependent circuit electrically coupled to the voltage controlled oscillator via the cross junction circuit and configured to provide the temperature dependent input current, wherein the analog temperature dependent circuit comprises a bandgap voltage reference circuit, wherein the temperature dependent input current comprises a complementary-to-absolute temperature (CTAT) current, wherein the bandgap voltage reference circuit is configured to produce a proportional-to-absolute temperature (PTAT) current and a temperature invariant current, and wherein the CTAT current is derived by subtracting the PTAT current from the temperature invariant current.

2. The system of claim 1, wherein the bandgap voltage reference circuit comprises at least one of a Brokaw bandgap reference circuit, a Widlar bandgap reference circuit, or a combination thereof.

3. The system of claim 1, wherein a percentage of the CTAT current is provided as the temperature dependent input current.

4. The system of claim 1, wherein the voltage controlled oscillator comprises a varactor circuit electrically coupled to the inductor circuit and configured to vary a capacitance value for the varactor circuit based on a capacitance input.

5. The system of claim 4, wherein the varactor circuit is configured to calibrate the voltage controlled oscillator so that the oscillation frequency output follows a first oscillation frequency curve based on the capacitance input having a first value.

6. The system of claim 5, wherein the varactor circuit is configured to calibrate the voltage controlled oscillator so that the oscillation frequency output follows a second oscillation frequency curve based on the capacitance input having a second value.

7. The system of claim 1, wherein the cross junction circuit comprises a first transistor device electrically cross coupled to a second transistor device.

8. The system of claim 7, wherein the temperature dependent input current is provided to a first drain of the first transistor device and to a second drain of the second transistor device.

9. The system of claim 8, wherein a first source of the first transistor device is electrically coupled to a first node of the inductor circuit and wherein a second source of the second transistor device is electrically coupled to a second node of the inductor circuit at an opposite end of the inductor circuit.

10. The system of claim 1, comprising a phase-locked loop (PLL) circuit that comprises the voltage controlled oscillator and configured to transform a first phase of the oscillation frequency output to match a second phase of an input signal.

11. The system of claim 10, wherein the input signal is provided by an oscillator or by a clock.

12. The system of claim 10, comprising a serializer-deserializer (SerDes) system that comprises the PLL circuit and configured to transform parallel data into serial data.

13. The system of claim 10, wherein the PLL circuit is electrically coupled to a parallel-to-serial converter to provide the oscillation frequency output to the parallel-to-serial converter.

14. A method, comprising:
selecting a temperature dependent current from an analog temperature dependent circuit; and
transmitting the temperature dependent current to a voltage controlled oscillator included in a phase-locked loop (PLL) circuit configured to transform a first phase of an oscillation frequency output to match a second phase of an input signal, wherein the PLL circuit is included a serializer-deserializer (SerDes) configured to transform parallel data into serial data, the voltage controlled oscillator comprising:
a cross junction circuit electrically coupled to the analog temperature dependent circuit;
an inductor circuit electrically coupled to the cross junction circuit;
a capacitor bank circuit electrically coupled to the inductor circuit;
an input node configured to receive a control voltage; and
an output node electrically coupled to the inductor circuit and configured to provide an oscillation frequency output, wherein the oscillation frequency output is controlled by the control voltage.

15. The method of claim 14, wherein selecting the temperature dependent current is performed either at a manufacturing facility or during field operations of the voltage controlled oscillator.

16. A PLL circuit, comprising:
a voltage controlled oscillator configured to transform a first phase of the oscillation frequency output to match a second phase of an input signal comprising:
a cross junction circuit electrically coupled to a temperature dependent input current;
an inductor circuit electrically coupled to the cross junction circuit;
a capacitor bank circuit electrically coupled to the inductor circuit;
an input node configured to receive a control voltage; and
an output node electrically coupled to the inductor circuit and configured to provide an oscillation frequency output, wherein the oscillation frequency output is controlled by the control voltage, wherein the PLL circuit is electrically coupled to a parallel-to-serial converter to provide the oscillation frequency output to the parallel-to-serial converter.

* * * * *